Figure 1:
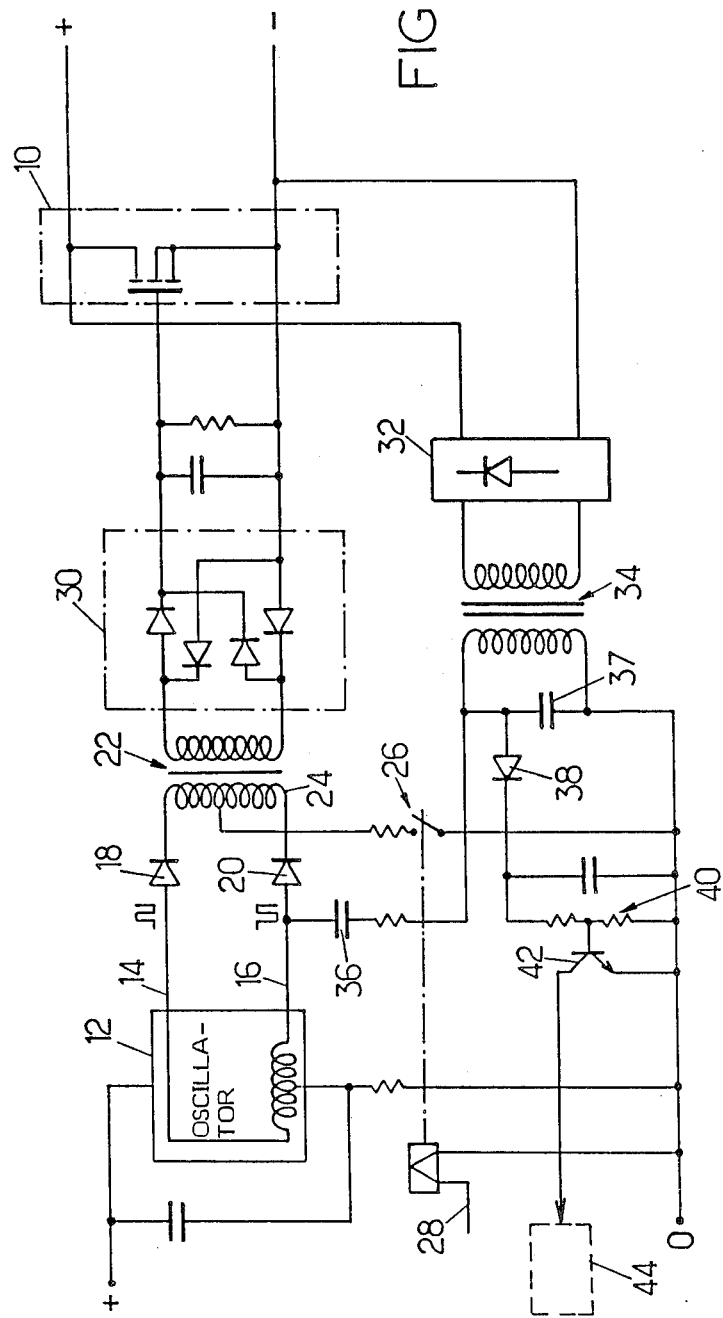

United States Patent [19]

Doittau et al.

[11] Patent Number: 4,710,645

[45] Date of Patent: Dec. 1, 1987

[54] DEVICE FOR MONITORING THE STATE OF AN ELECTRIC SWITCH OR AN ELECTRIC RELAY

[75] Inventors: Pierre O. Doittau, Villiers St Frederic; Hervé Moal, Velizy, both of France

[73] Assignee: Matra, Paris, France

[21] Appl. No.: 867,475

[22] Filed: May 28, 1986

[30] Foreign Application Priority Data

May 30, 1985 [FR] France ................... 8508134

[51] Int. Cl.4 .......................................... H03K 17/687
[52] U.S. Cl. .................. 307/115; 307/132 R; 307/132 E; 307/143; 307/571; 324/158 SC; 361/86; 361/88
[58] Field of Search ............... 307/115, 132 R, 132 E, 307/132 EA, 132 M, 143, 253, 571; 324/158 SC, 158 T, 119; 340/825.18, 644; 361/88, 86

[56] References Cited

U.S. PATENT DOCUMENTS 4,438,356 3/1984 Fleischer ........................... 307/571
4,634,903 1/1987 Montorfano ...................... 307/571

*Primary Examiner*—William M. Shoop, Jr.
*Assistant Examiner*—Sharon D. Logan
*Attorney, Agent, or Firm*—Stevens, Davis, Miller & Mosher

[57] ABSTRACT

A device for monitoring the state of a relay comprises an electrical insulation transformer whose secondary winding is connected, through a rectifier, to the output terminals of the relay. The primary winding of the transformer is in series with an oscillator having an impedance greater than that of the primary winding when the relay is closed. A transistor receives a signal from the primary winding and delivers an on-off output signal representing the impedance across the terminals of the relay.

7 Claims, 2 Drawing Figures

DEVICE FOR MONITORING THE STATE OF AN ELECTRIC SWITCH OR AN ELECTRIC RELAY

BACKGROUND OF THE INVENTION

1. Field of the invention

The invention relates to a device for monitoring the state of an electric switch having an open state and a closed state in which the closed state has an impedance less, by several orders of magnitude, than its impedance in the open state. It is suitable for use in all installations in a severe environment where monitoring of the control system of the switch is insufficiently reliable, since the state of the switch may not reflect that of the control system. The invention also relates to relays provided with such a monitoring devide and, in particular, solid state relays which have a history of being subject to breakdowns due to short circuiting of the solid state switch components which makes monitoring of the control particularly unreliable.

2. Prior art

Conventional electromechanical relays, while they are safe, have on the other hand numerous drawbacks, among which a large response time which limits the switching frequency, bouncing, sensitivity to a vibration environment, and wear of the contacts. Solid state relays have the advantage of a much shorter response time which allows switching rates beyond 10 kHz and currents comparable to those in electromagnetic relays when they use recently developed semiconductor components. But the risk of internal short circuits, which cannot be detected by monitoring the control, has led up to a now to reluctance to use solid state relays in a severe environment, particularly in launchers such as those used for launching satellites.

SUMMARY OF THE INVENTION

It is an object of the invention to provide a device for monitoring the state of an electric switch, i.e. for determining the actual condition of the switch rather than that of its control system, whether or not a DC voltage source is connected to the switch. To this end, there is provided an electric switch state monitoring device comprising an electrically insulated transformer having a first winding connected through a rectifier to the terminals of the switch and a second winding fed by an oscillator having an impedance substantially greater than that of the second winding when the relay is closed and further comprising means for analysing an electric signal picked up from said second winding.

Such a monitoring device is isolated galvanically from the switch by the transformer. It only comprises static or solid state components suitable for operation in a severe environment, including an intense radiation flux, which would detrimentally affect an opto-electronic coupler.

The monitoring device is based on the use of a transformer for detecting a variable load for an AC generator, typically at a high frequency so as to reduce the volume of the oscillator. But it would be sufficient to use an oscillator frequency substantially higher than the maximum switching frequency contemplated.

There is also provided a solid state relay, with state monitoring by a device of the above-defined kind, having a control circuit comprising an oscillator. In a first embodiment, the oscillator delivers two identical signals in phase opposition. A control circuit comprises a transformer controlling the solid state relay whose secondary winding is connected through a rectifier to the control electrode of the switch of the relay whose primary winding has two end terminals connected to the oscillator and a midpoint having control means for optionally isolating it or bringing it to a reference voltage for energizing the relay.

The oscillator controlling the relay will advantageously be of a type delivering radiofrequency squarewave signals, typically in the 100 kHz range. A magnetic oscillator may be used.

In that embodiment, the control oscillator may be used in the monitoring device and for controlling the relay. A drawback of that approach consists in that the oscillator must operate permanently. Another solution consists in providing two independent oscillators. Then the relay may be controlled via a transformer, whose primary winding need not have a midpoint, control of the relay being provided by energizing the oscillator.

Whatever the embodiment, the monitoring device is insulated galvanically from the relay and from the relay control system.

The monitored static relay of the invention provides safety equivalent to that of an electromechanical relay while being very much faster, having no bouncing, no wear and a high resistance to vibrations. The response time may be appreciably less than a millisecond. Such features make it particularly suitable for use in controls for mechanisms and firing controls for launchers.

The invention will be better understood from the following description of particular embodiments, given by way of examples. The description refers to the accompanying drawings.

SHORT DESCRIPTION OF THE DRAWINGS

Figure 2:
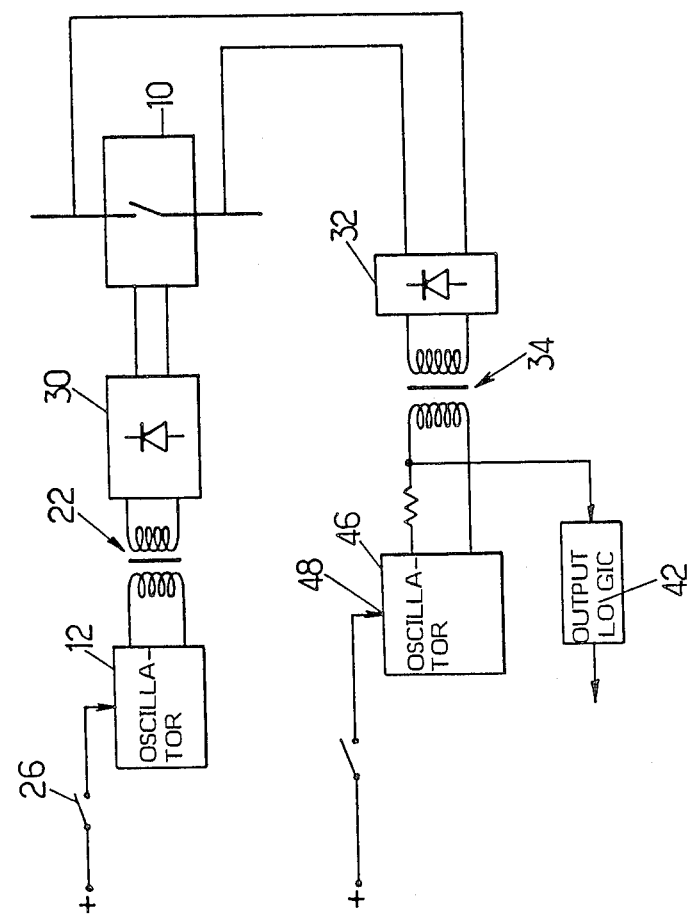

FIG. 1 is a general diagram of a monitored static relay according to a first embodiment of the invention; and FIG. 2 is a block diagram of a modified monitored relay.

DESCRIPTION OF THE INVENTION

Referring to FIG. 1, a static relay particularly suitable for high frequencies and high currents comprises a switch 10 formed by an n channel field effect transistor (FET), typically a "HEXFET" transistor. The monitoring device which is associated therewith is responsive to the drain-source impedance of the transistor, the drain-source DC voltage being always less than 2.5 V when the transistor is conducting. The transistor may typically be of a IRF 150 type which may achieve circuit breaking up to 50 V and a DC current of 5 A.

OPERATION OF THE SWITCH

The control device for switch 10 comprises a magnetic oscillator 12 which may be conventional and delivers, at two output terminals 14 and 16, squarewave voltage signals of opposite polarities. The signals are applied via diodes 18 and 20 to the terminals of the primary winding 24 of a transformer 22 for controlling the switch. The midpoint of the primary winding 24 of transformer 22 is connected to a component, shown as an electromechanical relay 26 but which will generally be a transistor, for connecting the midpoint at will to ground (for closing the switch 10) or for isolating the midpoint (so as to open the switch) depending on the voltage applied to the control input 28.

The voltage across the terminals of the secondary winding of transformer 22 is rectified by a full wave rectifier 30 and is applied to the gate of the FET switch 10.

SWITCH CONDITION MONITORING DEVICE

As shown in FIG. 1, the device for monitoring the state of the switch comprises an oscillator which is the oscillator 12, also controlling the switch. The state is monitored by measuring the RF impedance between the drain and source. The device comprises a rectifier 32 which may have the same construction as rectifier 30, whose two outputs are respectively connected to the drain and to the source of the FET switch 10 where the rectifier input is connected to the secondary winding of a transformer 34. The primary winding of the transformer is connected to a capacitor 37 and, through a capacitor 36 providing DC insulation and a resistor, to an output of oscillator 12. An output signal at the oscillator frequency is taken from the primary winding of transformer 34 and is applied, via a rectifying diode 38, a smoothing capacitor and a voltage divider resistor bridge 40, to a switching element delivering an on-off binary output, at a level compatible with the nature of a logic circuit 44. In the embodiment shown in FIG. 1, the switching element delivering an on-off output is a bipolar transistor 42 which supplies a TTL compatible output.

The embodiment shown in FIG. 1 has the advantage of requiring only one oscillator 12. On the other hand, the oscillator must operate permanently since it supplies the monitoring device. The embodiment shown in FIG. 2, in which the elements corresponding to those shown in FIG. 1 are designated by the same reference number, comprises two oscillators, which slightly complicates the system. On the other hand, the oscillator 12 controlling the switch 10 only operates when the switch is energized, which further allows the omission of the control formed by the switching member 26 in FIG. 1.

The embodiment shown in FIG. 2 comprises, in addition to the control oscillator 12, an oscillator 46 belonging to the monitoring device, having a supply input 48 for energizing the device. Switch 10 is controlled to be closed or opened depending on whether oscillator 12 is energized or not. The monitoring output is taken from the primary winding of the transformer 34 and may also control an on-off output member 42, which may again be a transistor.

By way of example, a device as illustrated in FIG. 1 has been constructed using an oscillator operating at a frequency of 240 kHz. The switching time delay was less than 20 microseconds at closure, and 400 microseconds at opening with a "HEXFET" transistor. The response time of the monitoring device was less than 200 microseconds on opening and or closure of the switch.

The invention is not limited to the particular embodiments which have been shown and described by way of examples.

I claim:
1. A device for monitoring an operating state of an electrical switch having a pair of output terminals, said switch, when in a closed state, having an impedance across terminals thereof lower than the impedance when said switch is in an open state by several orders of magnitude, comprising: an insulating transformer having a first winding and a second winding; rectifier means for connecting the first winding across said terminals of the switch; oscillator means having an impedance substantially higher than that of said second winding when said switch is in closed condition and in electric series relation with said second winding; and analysing means connected to said second winding and responsive to a signal received from said second winding.

2. A device according to claim 1, wherein said oscillator has an oscillation frequency higher than the maximum switching frequency of said switch.

3. A device according to claim 1, wherein said second winding has an end terminal connected to said oscillator and a second end terminal connected to a reference potential and wherein said analysing means are connected to that end terminal of the second winding which is connected to the oscillator.

4. In combination with a solid state relay including a solid state switch having a control electrode and a control circuit having an oscillator connected to said control electrode through rectifying means, a switch operating state monitoring device comprising: an insulating transformer having a first winding and a second winding; rectifier means for connecting the first winding across said terminals of the switch; means having an impedance substantially higher than that of said second winding when said switch is in closed condition for continuously delivering a RF voltage to said second winding; and analysing means connected to said second winding and responsive to a signal recieved from said second winding.

5. A static relay-monitoring device combination according to claim 4, wherein said oscillator of the control circuit also constitutes said oscillator means of the monitoring circuit and wherein said oscillator is connected to deliver two identical signals in phase opposition to the end terminals of the primary winding of a control transformer whose secondary winding is connected via rectifying means to said control electrode, said primary winding having a midpoint connected to control means for selectively insulating said midpoint or bringing said midpoint to a reference voltage.

6. A static relay-monitoring device combination according to claim 4, wherein said control circuit has an oscillator distinct from the oscillator of the monitoring system and which directly drives said control transformer.

7. A static relay-monitoring device combination according to claim 5, wherein said oscillator of the control circuit has a frequency in the hundred kHz range.

* * * * *